(12) United States Patent
Kawamoto et al.

(10) Patent No.: US 11,056,310 B2
(45) Date of Patent: Jul. 6, 2021

(54) CHARGED-PARTICLE BEAM DEVICE

(71) Applicant: Hitachi High-Tech Corporation, Tokyo (JP)

(72) Inventors: Yuta Kawamoto, Tokyo (JP); Akira Ikegami, Tokyo (JP); Yasushi Ebizuka, Tokyo (JP); Naoma Ban, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/471,291

(22) PCT Filed: Jan. 12, 2017

(86) PCT No.: PCT/JP2017/000699
§ 371 (c)(1),
(2) Date: Jun. 19, 2019

(87) PCT Pub. No.: WO2018/131102
PCT Pub. Date: Jul. 19, 2018

(65) Prior Publication Data
US 2019/0393014 A1 Dec. 26, 2019

(51) Int. Cl.
*H01J 37/145* (2006.01)
*H01J 37/147* (2006.01)
(Continued)

(52) U.S. Cl.
CPC .......... *H01J 37/145* (2013.01); *H01J 37/147* (2013.01); *H01J 37/20* (2013.01); *H01J 37/21* (2013.01);
(Continued)

(58) Field of Classification Search
None
See application file for complete search history.

(56) References Cited

U.S. PATENT DOCUMENTS 5,912,469 A * 6/1999 Okino ............... H01J 37/304
250/492.23
7,935,925 B2 5/2011 Sasaki et al.
(Continued)

FOREIGN PATENT DOCUMENTS

JP 3-75507 A 3/1991
JP 2003-22773 A 1/2003
(Continued)

OTHER PUBLICATIONS

International Search Report (PCT/ISA/210) issued in PCT Application No. PCT/JP2017/000699 dated May 9, 2017 with English translation (five (5) pages).
(Continued)

*Primary Examiner* — Andrew Smyth
(74) *Attorney, Agent, or Firm* — Crowell & Moring LLP (57) ABSTRACT

The objective of the present invention is to provide a charged-particle beam device capable of moving a field-of-view to an exact position even when moving the field-of-view above an actual sample. In order to attain this objective, a charged-particle beam device is proposed comprising an objective lens whereby a charged-particle beam is focused and irradiated onto a sample; a field-of-view moving deflector for deflecting the charged-particle beam; and a stage onto which the sample is placed. The charged-particle beam device is equipped with a control device which controls the lens conditions for the objective lens in such a manner that the charged-particle been focuses on the sample which is to be measured; moves the field-of-view via the field-of-view moving deflector while maintaining the lens conditions; acquires a plurality of images at each position among a reference pattern extending in a specified direction; and uses the plurality of acquired images to adjust the signal supplied to the field-of-view moving deflector.

10 Claims, 6 Drawing Sheets

(51) Int. Cl.
  H01J 37/20 (2006.01)
  H01J 37/21 (2006.01)
  H01J 37/22 (2006.01)
  H01J 37/244 (2006.01)
  H01J 37/28 (2006.01)

(52) U.S. Cl.
  CPC ............ *H01J 37/22* (2013.01); *H01J 37/244* (2013.01); *H01J 37/28* (2013.01); *H01J 2237/20285* (2013.01); *H01J 2237/2448* (2013.01)

(56) References Cited

U.S. PATENT DOCUMENTS

| | | | | |
|---|---|---|---|---|
| 2004/0081350 A1* | 4/2004 | Kitamura | ................ | G06T 7/001 382/149 |
| 2004/0211899 A1 | 10/2004 | Ezumi et al. | | |
| 2008/0298670 A1* | 12/2008 | Nakagaki | .............. | G06T 7/0004 382/149 |
| 2013/0146763 A1* | 6/2013 | Kawada | ................ | G01B 15/00 250/306 |
| 2015/0014531 A1* | 1/2015 | Yamazaki | ............... | H01J 37/28 250/311 |
| 2015/0136979 A1* | 5/2015 | Tachibana | ............... | H01J 37/10 250/310 |

FOREIGN PATENT DOCUMENTS

| | | | | | |
|---|---|---|---|---|---|
| JP | 2007-95576 | A | | 4/2007 | |
| JP | 2007095576 | A | * | 4/2007 | |
| JP | 2012-33336 | A | | 2/2012 | |
| JP | 2012033336 | A | * | 2/2012 | |
| JP | 2013-4888 | A | | 1/2013 | |
| JP | 2013004888 | A | * | 1/2013 | |
| JP | 5164355 | B2 | | 3/2013 | |
| JP | 2014-2835 | A | | 1/2014 | |
| JP | 2014002835 | A | * | 1/2014 | ............ H01J 37/263 |
| WO | WO 03/007330 | A1 | | 1/2003 | |
| WO | WO-03007330 | A1 | * | 1/2003 | ............ H01J 37/244 |
| WO | WO 2013/122020 | A1 | | 8/2013 | |
| WO | WO 2013/129147 | A1 | | 9/2013 | |

OTHER PUBLICATIONS

Japanese-language Written Opinion (PCT/ISA/237) issued in PCT Application No. PCT/JP2017/000699 dated May 9, 2017 (six (6) pages).

* cited by examiner

ized electron microscope, a technique (hereinafter, referred to as image shift) for moving a scanning position of an electron beam on a sample by a deflector has been known. Compared with a technique of moving the scanning position of the electron beam by moving a stage, the technique using the deflector can move the scanning position with high precision. PTL 1 discloses a charged-particle beam device which performs an accurate image shift by performing an image shift on a sample in which a plurality of patterns are arranged at predetermined known intervals, determining a difference between a reference position in the image and a center of gravity of the pattern, and performing an image shift that compensates for the difference.

CHARGED-PARTICLE BEAM DEVICE

TECHNICAL FIELD

The present invention relates to a charged-particle beam device, and more particularly to a charged-particle beam device including a deflector for moving a field-of-view by deflecting a charged-particle beam.

BACKGROUND ART

In a charged-particle beam device such as a scanning electron microscope, a technique (hereinafter, referred to as image shift) for moving a scanning position of an electron beam on a sample by a deflector has been known. Compared with a technique of moving the scanning position of the electron beam by moving a stage, the technique using the deflector can move the scanning position with high precision. PTL 1 discloses a charged-particle beam device which performs an accurate image shift by performing an image shift on a sample in which a plurality of patterns are arranged at predetermined known intervals, determining a difference between a reference position in the image and a center of gravity of the pattern, and performing an image shift that compensates for the difference.

PRIOR ART LITERATURE

Patent Literature

PTL 1: Japanese Patent No. 5164355 (corresponds to U.S. Pat. No. 7,935,925)

SUMMARY OF INVENTION

Technical Problem

As explained in PTL 1, the scanning position on a plurality of objects is positioned by using an image shift and the amount of electron beam deflection is corrected based on the deviation of the objects, so that the field-of-view movement accuracy of the image shift can be improved. However, when the field-of-view is moved by the image shift on an actual sample (for example, a semiconductor wafer), the field-of-view may not be positioned at an appropriate position, even if the above correction is performed.

The present invention aims to provide a charged-particle beam device capable of moving a field-of-view to an exact position even when moving the field-of-view above an actual sample.

Solution to Problem

An aspect for achieving the above objective proposes a charged-particle beam device including: an objective lens whereby a charged-particle beam emitted from a charged-particle source is focused and irradiated onto a sample; a field-of-view moving deflector which deflects the charged-particle beam; a stage on which the sample is disposed; and a control device. The control device is configured to control lens conditions for the objective lens in such a manner that the charged-particle beam focuses on a sample to be measured; move a field-of-view via the field-of-view moving deflector while maintaining the lens conditions; acquire an image for each of a plurality of reference patterns arranged in a specified direction, or acquire a plurality of images at each position among a reference pattern extending in a specified direction; and use the plurality of acquired images to adjust the signal supplied to the field-of-view moving deflector.

Advantageous Effect

According to the above configuration, high accuracy of field-of-view movement can be achieved even if there is a fluctuation in the magnetic field for adjusting the charged-particle beam.

DESCRIPTION OF EMBODIMENTS

In recent years, with the miniaturization and three-dimensional structuring of semiconductor devices, device design and manufacturing processes are becoming more complicated. It is necessary to inspect and measure a large number of fine patterns in starting up a complicated manufacturing process. Charged-particle beam devices, such as scanning electron microscopes, are used in such inspection and measurement of semiconductor devices. The scanning electron microscope is a device for performing inspections and measurements using acquired images by scanning a focused electronic beam on a sample.

In order to perform many inspections and measurements in a short time, it is necessary to speedily capture inspection locations and measuring locations in a Field-Of-View (FOV) of the scanning electron microscope. In such field-of-view movement, in comparison with stage movement, an image shift technique that can move the scanning position of an electron beam at high speed and with high accuracy is suitable. When performing an image shift, a sample in which patterns are arranged at known predetermined intervals is prepared, and the field-of-view movement using an image shift deflector is performed to capture these patterns in the field-of-view. The image shift can be performed with high accuracy by calibrating a deflection signal, but in actuality, even if such calibration is performed, there are cases where proper field-of-view movement cannot be performed. A focus condition of the sample to be actually measured or inspected is changed due to the thickness of the sample and the charge attached to the sample. When the sample used for calibration of the deflection position and the sample to be measured or inspected are different, the focus conditions may differ, and the conditions of an electromagnetic lens for focusing the beams also change, and such change in the conditions affects the deflection accuracy. In other words, compared with the case where the deflection position is calibrated by the image shift, when a control parameter (control current) set in the electromagnetic lens or the deflector is changed, a generated magnetic field is also changed, high deflection accuracy cannot be maintained. Further, it is conceivable that the influence of hysteresis and temperature change of a magnetic substance used for the electromagnetic lens cannot be ignored.

In the embodiments described below, regardless of the influence of the hysteresis and temperature change of the magnetic substance used for the electromagnetic lens, a charged-particle beam device capable of performing highly accurate field-of-view movement will be described.

Embodiments described below describe, for example, a charged-particle beam device including: an objective lens whereby a charged-particle beam from a charged particle source is focused and irradiated onto a sample; a field-of-view moving deflector which deflects the charged-particle beam; and a stage on which the sample is disposed, in which the charged-particle beam device changes control parameters (control current) of the electromagnetic lens on the sample to be measured to conduct a focus adjustment, after moving to the reference pattern by the stage while maintaining the control parameters, a plurality of images of the reference pattern are acquired while changing a field-of-view movement amount, a rotation angle due to a magnetic field is calculated from acquired images of reference patterns, after correcting the amount of current and a voltage value applied to the field-of-view moving deflector from the rotation angle, the charged-particle beam device is moved to the measurement point of the sample by the stage, so as to start the measurement and inspection of the object sample.

According to such a configuration, even if the magnetic field generated by the charged-particle beam device changes between the sample to be measured or inspected and the sample for calibration, it becomes possible to accurately move field-of-view by the image shift.

Figure 1:
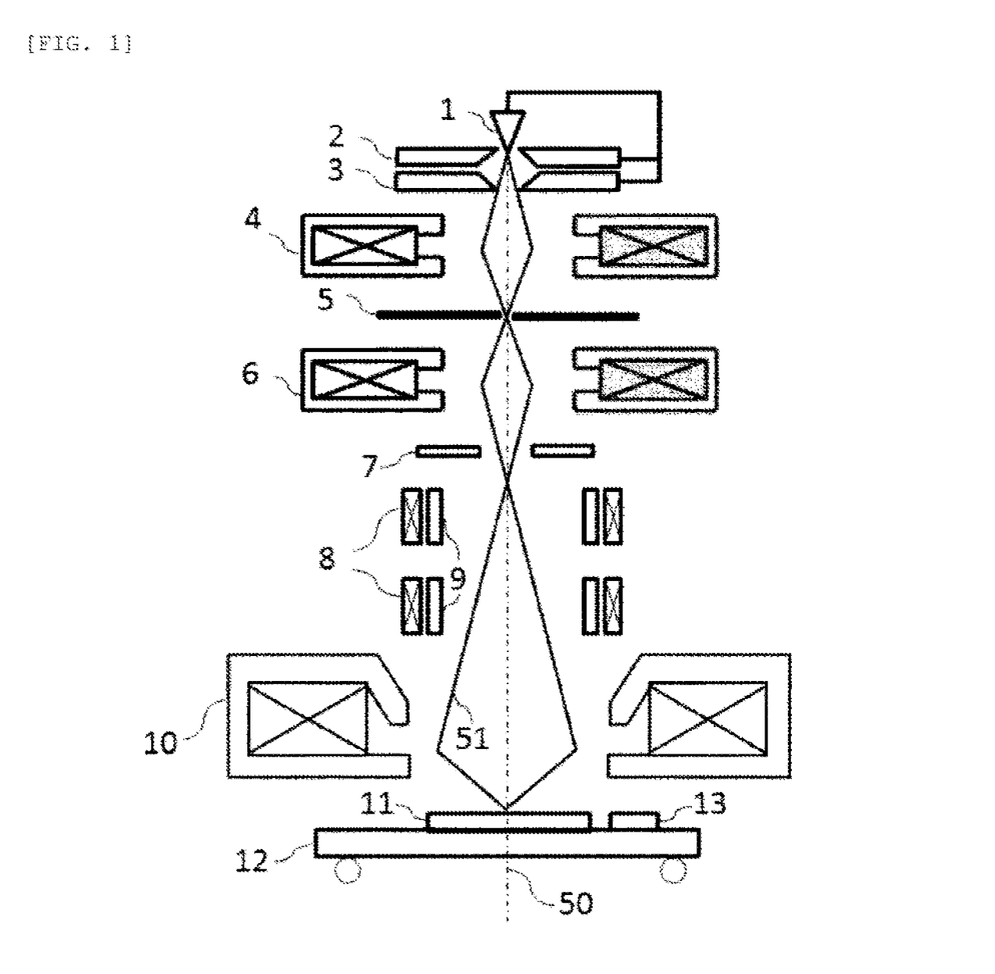
FIG. 1 is a diagram illustrating an overview of a scanning electron microscope including a field-of-view moving deflector.

Hereinafter, the charged-particle beam device including the field-of-view moving deflector will be described using the drawings. FIG. 1 is a schematic diagram illustrating the scanning electron microscope including the field-of-view moving deflector. The scanning electron microscope illustrated in FIG. 1 includes a field-of-view moving deflector including an electromagnetic deflector 8 and an electrostatic deflector 9. These field-of-view moving deflectors do not necessarily have to include both the electromagnetic type and the electrostatic type, and may include either one. In addition, both of the electromagnetic type and the electrostatic type may have two or more deflectors. A primary electron 51 extracted from an electron source 1 by a first anode 2 is accelerated by a second anode 3 and focused by a first condenser lens 4, and then passes through an objective aperture 5. After that, the primary electron 51 is focused by a second condenser lens 6 and then focused onto a sample 11 by an objective lens 10.

As methods of moving the field-of-view between different measurement points, there are a method of positioning a focal point of the primary electron 51 at a desired position on the sample 11 by driving a sample stage 12 for placing the sample 11, and a method (image shift) of moving the field-of-view (scanning area) of the scanning electron microscope by electrically deflecting the primary electron 51 by the electromagnetic deflector 8 or the electrostatic deflector 9 and changing the arrival position of the primary electron 51 on the sample 11. Since stage movement accompanies mechanical motion, it is difficult to move the field-of-view at high speed. Furthermore, the field-of-view movement accuracy is lower compared with the image shift. However, high quality images can be acquired even if a large field-of-view movement of, for example, 100 mm or more is performed. The image shift, on the other hand, has the advantage of being able to move the field-of-view accurately in a short time as compared to stage movement since the amount of deflection is controlled by the current and voltage applied to the deflector. However, for example, when performing field-of-view movement of tens of μm or more, since the beam is largely deviated from an ideal optical axis 50, the image quality may be degraded due to the off-axial aberration of the objective lens 10.

When a sample of which measurement points are with a high density is measured, such as a hot spot analysis of a logic device, if an image shift of a large area of hundreds of μm and high-quality image acquisition can be compatible, a plurality of measurement points within am image shift range can be captured. For this reason, the number of times of stage movement at the time of measurement decreases, and the time required for multipoint measurement can be significantly shortened. Further, with the miniaturization of semiconductor devices, there is an increasing demand for measurement and inspection of a fine pattern of 10 nm or less. In order to cope with inspection and measurement of such a fine pattern, it is required to improve the measurement accuracy by acquiring an image at a high magnification. However, when an image is acquired at a high magnification, the field-of-view is narrowed, so that it is difficult to capture the fine pattern in the field-of-view. Therefore, it is desirable to accurately perform the field-of-view movement using the image shift rather than stage movement.

However, even if the image shift is used, it is very difficult to maintain the field-of-view movement accuracy of 10 nm or less while performing the image shift of a large area of several hundreds of μm. This is because the scanning electron microscope often uses the electromagnetic lens as the objective lens for high resolution, and the field-of-view movement accuracy of the image shift is greatly influenced by the magnetic field fluctuation of the electromagnetic lens. For example, when an image shift of 100 μm is performed, in order to maintain the field-of-view movement accuracy of 10 nm or less, it is necessary to precisely adjust the rotation angle of the primary electron 51 due to the magnetic field with an accuracy of 0.005°. It is difficult to avoid the magnetic field fluctuation of the electromagnetic lens, since the magnetic field fluctuation is generated due to the hysteresis or temperature change of the magnetic body constituting the electromagnetic lens. Therefore, even if the field-of-view movement amount is adjusted with a high precision in advance, if a relationship between the control parameter when the sample to be measured is observed and an actually generated magnetic field is slightly different from the relationship during the adjustment, the field-of-view movement accuracy of the image shift will be reduced.

Hereinafter, a first embodiment describes an image acquiring sequence or a processing sequence for measuring and inspecting which makes it possible to accurately perform a field-of-view movement, even if the magnetic field changes due to hysteresis or temperature change of the magnetic substance contained in the electromagnetic lens on the sample to be measured. The scanning electron microscope as illustrated in FIG. 1 is controlled by a control device which is not illustrated. Further, the control device incorporates an image arithmetic processing unit and a storage medium which stores an operation program for automatically executing a processing sequence described later. According to the operation program, the image processing unit generates an image based on the detection signal acquired by the scanning electron microscope, and executes necessary arithmetic processing. Further, the control device also performs a mechanism system control such as a stage, and performs an optical system control such as beam deflection or focusing according to the operation program. It also applies to the embodiments described later.

Figure 2A:
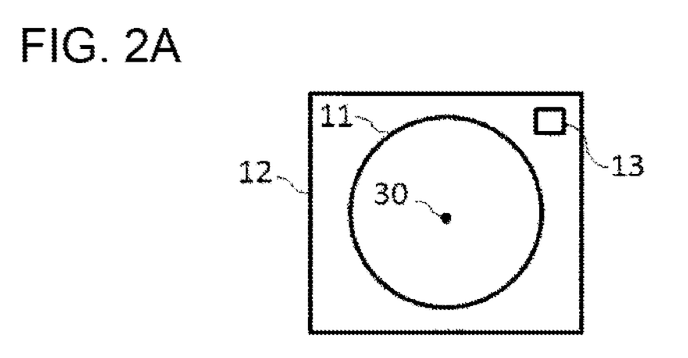
FIGS. 2A and 2B are diagrams illustrating examples of reference pattern and a position relationship between a sample to be measured and the reference pattern.
Figure 2B:
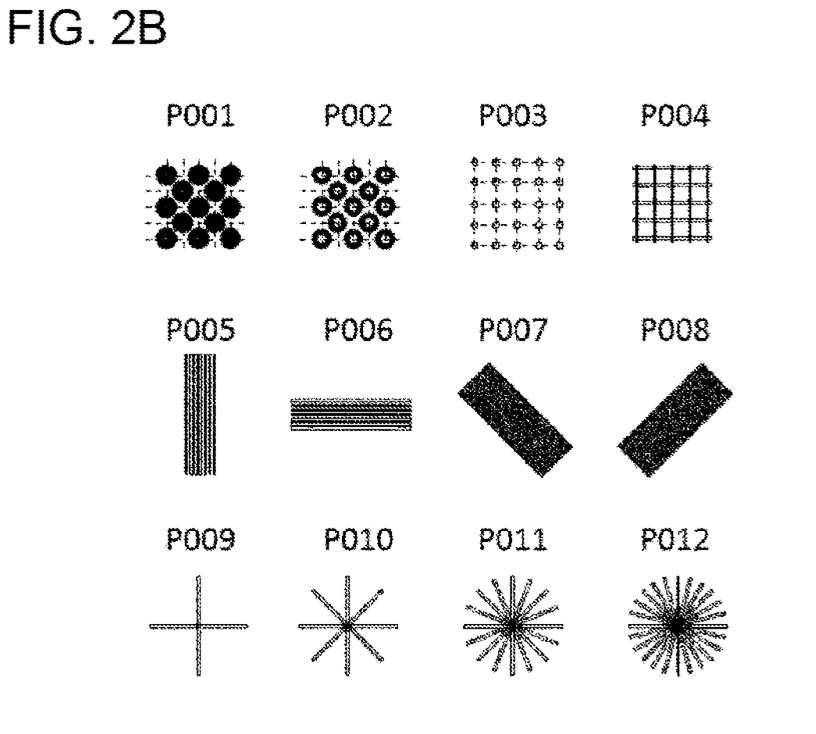

FIG. 2 is a diagram illustrating an overview of the stage 12 on which the sample 11 to be measured or inspected is disposed. A space for mounting a reference pattern (standard sample or calibration sample) 13 is provided on the stage 12. As described above, both of the sample 11 and the reference pattern 13 are disposed on the stage 12, and both of them can be positioned directly below the ideal optical axis 50 by moving the stage. One example of the reference pattern 13 is illustrated in FIG. 2(b).

P001, 002, 003 and 004 show samples in which specific patterns are periodically arranged. By calibrating a field-of-view movement position using the pattern arranged in such two-dimensional direction, it becomes possible to perform calibration independent of the field-of-view movement direction. Further, P005, 006, 007 and 008 illustrate reference patterns including long line patterns in a specific direction. With the recent miniaturization of patterns, the line width of line patterns tends to be narrower. That is, a ratio of the length of the line pattern to the line width tends to be larger. In order to measure such an entire line pattern with high magnification (narrow field-of-view), it is necessary to appropriately move the high magnification field-of-view along the line pattern. By performing a calibration using a pattern illustrated in P005, 006, 007 and 008, it is possible to perform the field-of-view movement with high accuracy when measuring a long pattern in a specific direction over a wide range. Further, it is also possible to use a radial pattern illustrated in P009, 010, 011 and 012. Here, when an inclined pattern such as P007, 008, 010, 011 and 012 is used, it is desirable to grasp the inclined angle thereof in advance.

Figure 3:
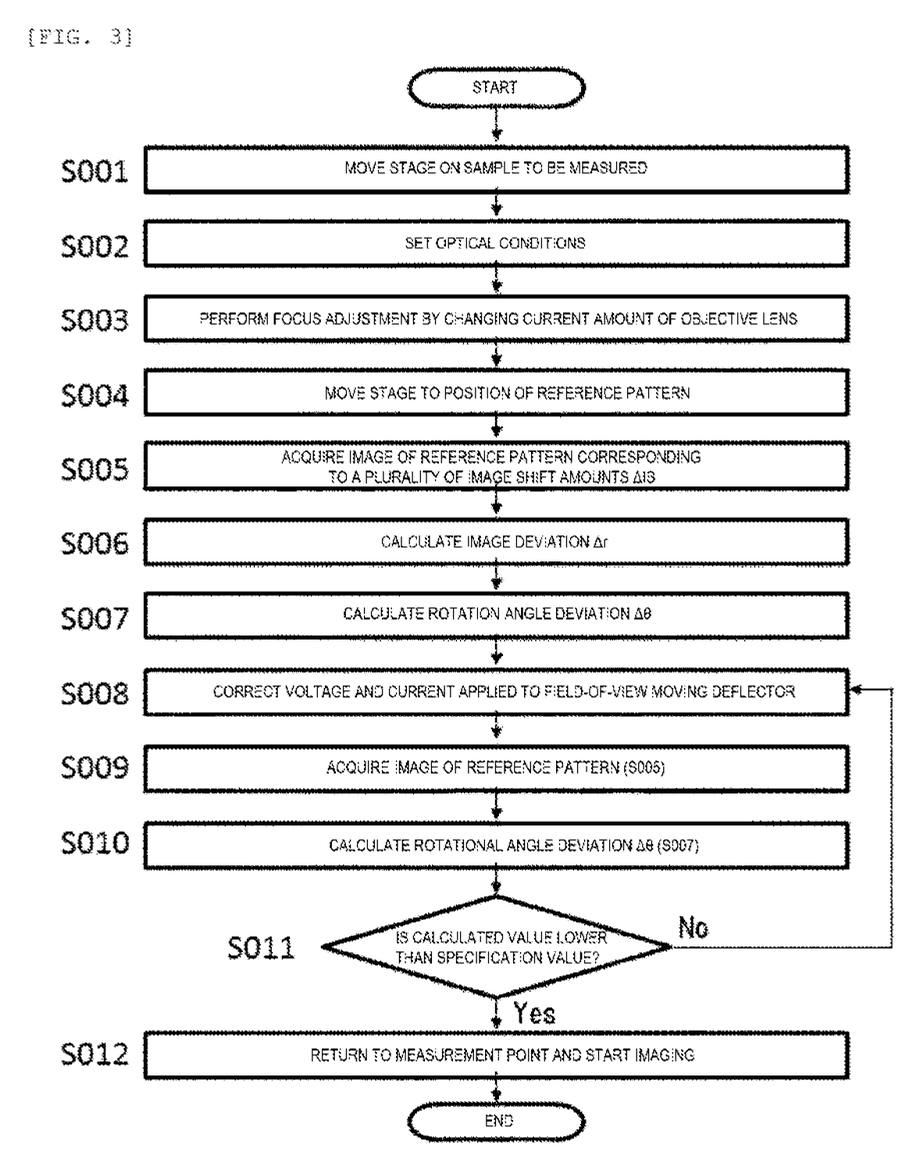
FIG. 3 is a flowchart showing steps of calculating a rotation angle deviation due to a magnetic field of an electromagnetic lens and correcting the amount of current and a voltage value applied to the field-of-view moving deflector.

The measurement processing procedure using the calibration sample as described above will be described along the flowchart of FIG. 3. As described above, an operation program for automatically executing the processing illustrated in FIG. 3 is stored in a storage medium (memory) which is not illustrated, and the control device controls the mechanical system such as a stage, an electron microscope optical system and the image processing unit according to this operation program.

Firstly, the stage is moved such that a measurement point 30 on the sample 11 to be measured is located directly below the ideal optical axis 50 (S001). The measurement point 30 may be a place where there is a pattern to be actually inspected and measured, or may be selected and used as a representative position of the center position of the sample 11 or the like. At this time, it is desirable that the field-of-view movement amount (the field-of-view movement amount by the image shift) by the deflection of the electron beam become as small as possible. In addition, it is assumed that the pattern to be actually measured and the focusing condition are the same or similar (the sample height and the charging conditions are the same or similar).

Next, the desired optical conditions used for measurement are set. Here, the optical conditions indicate the electron source 1, the first anode 2, the second anode 3, the first condenser lens 4, the second condenser lens 6, and the amount of current and a voltage value applied to the objective lens 10. Then, the focus is adjusted by changing the current value supplied to the objective lens 10 which is an electromagnetic lens (S003). At this time, it is desirable to select an optimum magnification for the focus adjustment in accordance with the pattern shape of the measurement point 30. Next, the stage is moved such that the field-of-view of the electron beam is positioned at the position of the reference pattern 13 (S004). At this time, attention is paid so as not to change the amount of current applied to the objective lens 10 set in S003. That is, an image of a reference pattern is generated while maintaining the focus condition adjusted by focus evaluation using an image obtained based on electron beam irradiated onto a sample (measurement target pattern) to be measured. This is because changing the focus condition (magnetic field condition) may change the field-of-view movement condition.

When it is necessary to adjust the focus during moving to the position of the reference pattern 13, any one of the control values of the electrostatic lenses is changed. As an example of the control value of the electrostatic lens, there is a voltage value applied to the objective lens 10, or a voltage value applied to the sample 11, or the like. Next, the image of the reference pattern 13 is acquired for the field-of-view movement amount IS by a plurality of different image shifts (S005).

Figure 4:
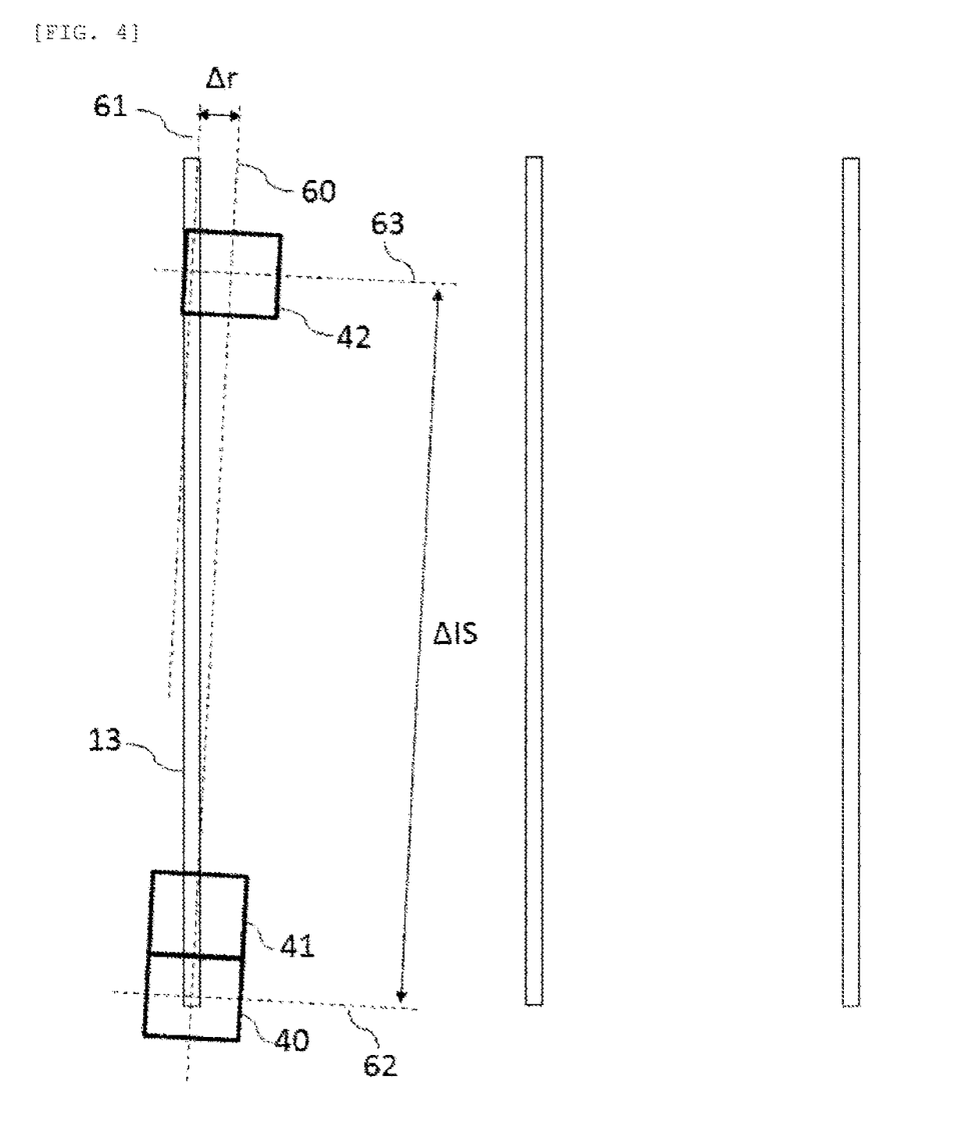
FIG. 4 is a diagram illustrating an example of an acquired image for calculating the rotation angle deviation due to the magnetic field of the electromagnetic lens.

An example of the acquired image is shown in FIG. 4. Here, the case of a long line pattern will be described. First, an image 40 is acquired at IS=(X1, Y1). Here, X1 and Y1 respectively indicate the field-of-view movement amounts in the X direction and Y direction of IS, and the values of X1 and Y1 when acquiring the image 40 are arbitrary. When IS=(X, Y) is input, a control device (not shown) calculates the current supplied to the field-of-view moving deflectors 8, 9 and the voltage value applied thereto. Here, an example of the calculation formula used is shown below (Formula 1).

$$\begin{pmatrix} Vx \\ Vy \end{pmatrix} = \begin{pmatrix} a & b \\ c & d \end{pmatrix} \begin{pmatrix} X \\ Y \end{pmatrix} \qquad \text{Formula 1}$$

Here, Vx and Vy respectively indicate the amount of current and the voltage value applied to the field-of-view moving deflectors 8, 9. The parameters a, b, c and d are set in advance to values obtained by experiments or calculations.

Next, IS input such that the field-of-view moves along the line pattern. In the case of a long line pattern in the vertical direction (Y direction), IS=(X1, Y2) is input (here, Y1 ≠ Y2), and an image 41 is acquired. Hereinafter, an image 42 and the like are acquired while similarly changing the IS. Although IS=(X1, Y3) at the time of acquiring the image 42 is arbitrary, it is desirable that the difference between Y1 and Y3 is large. However, in order to specify the field-of-view fluctuation according to each image shift position more accurately, it is desirable to increase the image acquisition amount of different field-of-view movement amounts.

Next, from the images 40, 42 acquired in S005, an image deviation Δr in the direction perpendicular to the line pattern is calculated (S006). Here, if there is a center axis of the line pattern at the image center in the image 40, Δr becomes a distance between an image center ($x_c$, $Y_c$) of the image 42 and a line pattern center 70 in the x direction (direction of line segment 63) of the image 42. When specifying a center position of the pattern using the image 40, if the image center and the center axis of the line pattern do not match, a difference value Δrb between the center position of the pattern in the image 40 and the pattern center coordinates and the image center is determined, and this difference value is included to perform an operation as described later. That is, Δr (Δrb) is calculated for the image 40 as described above, and the difference between the Δr and the Δr in the image 43 is used as Δr by the image shift in the following calculation.

Next, based on Δr calculated in S006, a rotation angle deviation Δθ is calculated (S007). Since Δθ and Δr have a relationship of ΔIS×Δθ=Δr, the rotation angle deviation Δθ can be calculated by ΔθO=Δr/ΔIS. Here, ΔIS is the difference in field-of-view movement amounts by the image shift input when the images 40, 42 are acquired, and ΔIS in the example of S005 is an absolute value of a difference between Y1 and Y3. Next, based on the calculated rotation angle deviation Δθ, at least one of the current value supplied to the field-of-view moving deflectors 8, 9 and the voltage value applied thereto is corrected using the following equation (Formula 2) (S008).

$$\begin{pmatrix} Vx \\ Vy \end{pmatrix} = \begin{pmatrix} \cos \Delta\theta & \sin \Delta\theta \\ -\sin \Delta\theta & \cos \Delta\theta \end{pmatrix} \begin{pmatrix} a & b \\ c & d \end{pmatrix} \begin{pmatrix} X \\ Y \end{pmatrix} \quad \text{Formula 2}$$

Further, in S004, when the focus adjustment is performed by changing the control value of the electrostatic lens by ΔV, correction is performed using the following equation (Formula 3).

$$\begin{pmatrix} Vx \\ Vy \end{pmatrix} = \frac{1}{M_{\Delta V}} \begin{pmatrix} \cos \theta_{\Delta V} & \sin \theta_{\Delta V} \\ -\sin \theta_{\Delta V} & \cos \theta_{\Delta V} \end{pmatrix}$$
$$\begin{pmatrix} \cos \Delta\theta & \sin \Delta\theta \\ -\sin \Delta\theta & \cos \Delta\theta \end{pmatrix} \begin{pmatrix} a & b \\ c & d \end{pmatrix} \begin{pmatrix} X \\ Y \end{pmatrix}$$
$$M_{\Delta V} = A \cdot \Delta V$$
$$\theta_{\Delta V} = B \cdot \Delta V$$

Formula 3

$\theta_{\Delta V}$ is a change in rotation angle due to a magnetic field caused by changing the control value of the electrostatic lens by ΔV, and $M_{\Delta V}$ is a change in magnification of the electrostatic lens caused by changing the control value of the electrostatic lens by ΔV. Here, the parameters of A and B are set in advance to values acquired by experiments or calculations. Here, although the control equation for the image shift is corrected by using the parameters (A, B) acquired in advance, the correction can be performed without the influence, such as hysteresis, by performing focus adjustment on the electrostatic lens when moving to the reference pattern 13.

Next, in S009 and 010, the image shift on the reference pattern by the deflection signal corrected by the correction signal obtained as described above, the image acquisition (S009), and the rotation shift calculation (S010) are performed, so as to determine whether the rotation angle deviation Δθ satisfies a specified value (S011). That is, it is verified (confirmed) whether the correction using the reference patterns is properly performed or not.

Here, it is desirable that a specified value Δθth is determined from Δθth=ISp/ISmax, in which ISp is the field-of-view movement accuracy of the image shift to be determined, and ISmax is the field-of-view movement amount by the maximum image shift used in inspection and measurement of the sample to be measured. ISmax may be calculated as the amount of field-of-view movement by the largest image shift expected from the inspection point on the sample to be measured, the positional relationship of the measurement points, the inspection, and the order of measurement, and may be reused as the values of the resolution deterioration due to the off-axis aberration of the objective lens that occurs when the image shift is operated, the maximum output voltage and current value of the power supply that applies voltage and current to the field-of-view moving deflectors 8, 9 and output restriction by the control soft.

If the rotation angle deviation Δθ calculated in S010 is smaller than the specified value Δθth, the stage is moved to the measurement point 30 to start inspection and measurement of the sample to be measured. If the rotation angle deviation Δθ is larger than the specified value Δθth, the process returns to S008 and is repeated until the specified value is satisfied.

If the above procedure is used, even if the relationship between the current value applied to the electromagnetic lens and the actually generated magnetic field is changed due to the hysteresis or temperature change of the electromagnetic lens, it is possible to accurately perform the field-of-view movement on the sample to be measured by the image shift.

The second embodiment relates to a method for accurately moving the field-of-view by the image shift even when the sample to be measured is charged by the irradiation of the electron beam. When the sample is charged, the focal point of the electron beam deviates from the sample surface, which makes it difficult to inspect and measure the sample with a high image quality, and thus focus adjustment is necessary. This focus adjustment changes the rotation angle due to the magnetic field. Such change of the rotation angle occurs similarly no matter which of the current value applied to the objective lens 10 for focus adjustment, the voltage value applied to the objective lens 10 and a negative voltage 14 (hereinafter also referred to as a retarding voltage) applied to the sample 11 is used.

Even if an electrostatic lens is used, the rotation angle is changed because the energy of the electron is changed when passing through a region with the magnetic field. Hereinafter, a charged-particle beam device capable of performing correction processing when a sample is charged will be described using a configuration shown in FIG. 5.

Figure 5:
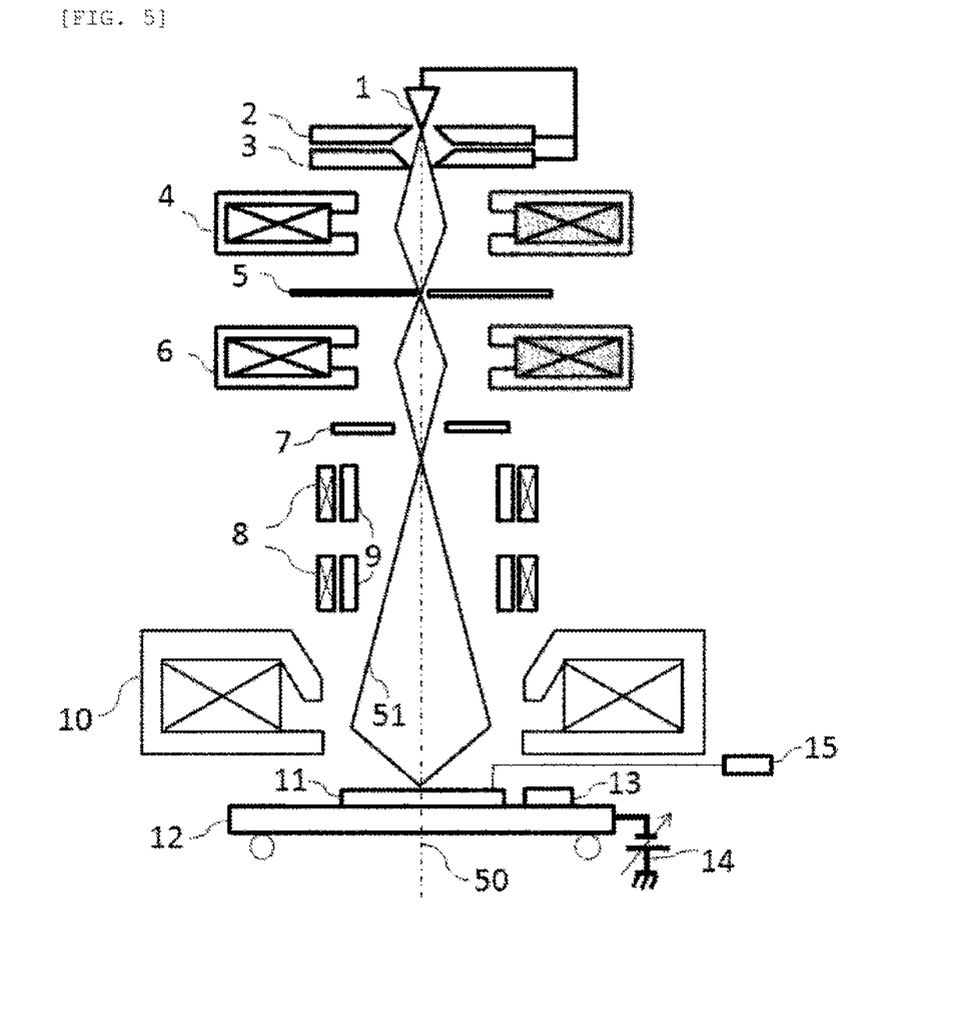
FIG. 5 is a diagram illustrating an overview of a scanning electron microscope including the held-of-view moving deflector.

The charged-particle beam device illustrated in FIG. 5 is provided with a Surface Potential Measurement (SPM) 15 for measuring the surface potential of a sample. The potential of the sample can be measured by using the SPM. In addition, the arithmetic processing unit provided in the control device can store the potential of each position on the sample and can determine an average potential of the predetermined region of the sample.

Hereinafter, a specific sequence will be described based on the flow shown in FIG. 3. S001 and 002 are the same as those in the first embodiment. In S003, after the amount of current of the objective lens 10 is changed to perform focus adjustment, SPM is used to measure a potential VW of the sample to be measured. Here, instead of using SPM, the potential measurement may be performed based on an image obtained when the negative voltage 14 applied to the sample is set lower than the energy of the electron beam, and the electron beam is repelled before reaching the sample. As another means, an energy filter may be provided in advance between the reflecting plate 7 and the sample 11, or between the detector and the sample in the case of a detector that directly detects the electron irradiated from the sample. The charged amount can be determined by calculating a difference between a curve (S curve) showing a relationship between a voltage when the retarding voltage is swept and a detected amount of the electron and an S curve showing the state in which no charge is obtained in advance.

S004, 005, 006 and 007 are similar to those in the first embodiment. Next, when the deflection signal in S008 is corrected, if an electrostatic lens is selected for focus adjustment when the stage is moved to the position of the reference pattern 13 in S004, the correction formula differs depending on the type of electrostatic lens. As an example, when the voltage value applied to the objective lens 10 is selected, the case where the negative voltage 14 applied to the sample is selected will be described. Firstly, the case where the focus adjustment is performed by changing the voltage value applied to the electrostatic lens included in the objective lens by $\Delta V$ will be described. The rotation angle deviation $\Delta \theta$ obtained in S007 is influenced by the voltage change $\Delta V$ at the time of focus adjustment and the electrification VW of the sample. In order to accurately move the field-of-view by the image shift in the sample 11 to be measured, it is necessary to use a correction equation in consideration of these influences. The correction equation (Formula 4) in this case is shown below.

$$\begin{pmatrix} Vx \\ Vy \end{pmatrix} = \frac{1}{M_{\Delta V} M_{V_W}} \begin{pmatrix} \cos(\theta_{\Delta V} + \theta_{V_W}) & \sin(\theta_{\Delta V} + \theta_{V_W}) \\ -\sin(\theta_{\Delta V} + \theta_{V_W}) & \cos(\theta_{\Delta V} + \theta_{V_W}) \end{pmatrix}$$ Formula 4

$$\begin{pmatrix} \cos \Delta \theta & \sin \Delta \theta \\ -\sin \Delta \theta & \cos \Delta \theta \end{pmatrix} \begin{pmatrix} a & b \\ c & d \end{pmatrix} \begin{pmatrix} X \\ Y \end{pmatrix}$$

$$M_{\Delta V} = A1 \cdot \Delta V$$

$$\theta_{\Delta V} = B1 \cdot \Delta V$$

$$M_{V_W} = A2 \cdot V_W$$

$$\theta_{V_W} = B2 \cdot V_W$$

Here, the parameters of A1, A2, B1 and B2 are set in advance to values acquired by experiments or calculations. Further, it should also be noted that A1 and A2 are different values. Similarly, B1 and B2 are different values.

Next, the case where focus adjustment is performed by changing the negative voltage 14 applied to the sample by $\Delta V$ will be described. In this case, since the rotation angle deviation by charging and the rotation angle deviation by focus adjustment are both caused by changes in the sample potential, the correction equation (Formula 5) is as follows.

$$\begin{pmatrix} Vx \\ Vy \end{pmatrix} = \frac{1}{M_{\Delta V}} \begin{pmatrix} \cos \theta_{\Delta V} & \sin \theta_{\Delta V} \\ -\sin \theta_{\Delta V} & \cos \theta_{\Delta V} \end{pmatrix}$$ Formula 5

$$\begin{pmatrix} \cos \Delta \theta & \sin \Delta \theta \\ -\sin \Delta \theta & \cos \Delta \theta \end{pmatrix} \begin{pmatrix} a & b \\ c & d \end{pmatrix} \begin{pmatrix} X \\ Y \end{pmatrix}$$

$$M_{\Delta V} = A2 \cdot (\Delta V - V_W)$$

$$\theta_{\Delta V} = B2 \cdot (\Delta V - V_W)$$

Here, the parameters of A1 and B2 are set in advance to values acquired by experiments or calculations. It should be noted that a common coefficient is used when calculating $\theta_{\Delta V}$ and $M_{\Delta V}$ from the electrification VW of the sample to be measured and the variation $\Delta V$ of the negative voltage 14 for focus adjustment.

Hereinafter, S009, 010,011 and 012 are similar to those in the first embodiment. By using such control, even if the potential of the sample 11 to be measured and the potential of the reference pattern 13 are different, the rotation angle deviation due to the magnetic field of the objective lens can be precisely controlled, and it is possible to accurately perform field-of-view movement by the image shift.

The third embodiment relates to a sequence for detecting decreases in field-of-view movement accuracy of image shift during measurements and inspections of a sample to be measured, and readjusting the relationship of the image shift input amount and the amount of current and the voltage value applied to the field-of-view moving deflector, and for. In the inspection and measurement of semiconductor devices, a large amount of inspection and measurement may be required for the same sample, and it may take several tens of hours from the start of measurement to the end of measurement. In such long-term inspection and measurement, the sample height may change due to expansion and contraction of the stage 12 due to changes in the device environment (such as air pressure and temperature), and the field-of-view movement accuracy of the image shift may be reduced. According to this embodiment, it is possible to accurately perform the field-of-view movement by the image shift even in the inspection and measurement for a long time.

In the inspection and measurement of semiconductor devices, a portion to be observed is determined in advance, and pattern matching between design data of a pattern shape and an acquired image is often possible. In this embodiment, when the field-of-view movement between these patterns is performed by the image shift, pattern matching between the acquired image and the design data is performed. The pattern matching may be performed at all observation points, or may be performed by designating an interval such as one point at several points. Alternatively, conditions, such as when a constant time has elapsed from previous pattern matching, may be provided. When such conditions are set, even when pattern matching between the acquired image and the design data cannot be performed, it is possible to prevent the deterioration in the field-of-view movement accuracy by the image shift.

If the field-of-view movement by the image shift is accurate, the pattern to be measured can be captured at the center of the field-of-view of the SEM, but if the field-of-view movement accuracy decreases, it is conceivable that the pattern will be located at the edge of the FOV and the pattern cannot be captured within the FOV. In such a case, the sequence shown in FIG. 3 is executed (that is, the rotation angle determination of the image shift at the time of field-of-view movement using the reference pattern is performed), and the relationship between the image shift input amount and the current and the voltage value applied to the field-of-view moving deflector is re-adjusted. In other words, the necessity of the field-of-view movement to the reference pattern is determined according to a result of the pattern matching. Here, it should be noted that even if the pattern is not located within the FOV, the field-of-view movement of the image shift may be accurate. For example, the pattern may not be formed, or may be formed but the position is different from the design. Even in such a case, it is possible to determine whether the degradation of the field-of-view movement accuracy of the image shift has occurred, or the pattern cannot be formed as designed by acquiring the image of the same observation point again after executing the sequence shown in FIG. 3, and in the case of the former, it is possible to feed back to the device manufacturing process.

If such a sequence is used, it is possible to detect and re-adjust the deterioration of the field-of-view movement accuracy by the image shift, so even if the inspection and measurement are performed for a very long time, the field-of-view movement accuracy of a high image shift can be maintained. Furthermore, the control method of the present embodiment is not limited to changes in temperature and air pressure, but also when the charge state changes temporally or spatially or when the pattern shape is deformed by irradiation of a charged-particle beam, the control method can be used as a means for readjusting the field-of-view movement by the image shift.

In the meantime, as a trigger for performing readjustment, it is conceivable that there may be a failure in the matching (for example, there are no matching score patterns above a predetermined value in the field-of-view, a plurality of matching score patterns above the predetermined value, etc. within the field of view). However, the difference between the field-of-view center (or the original matching position) and the matching position may be monitored in advance, and readjustment may be performed when the difference becomes equal to or greater than a predetermined value. In addition, time change of the matching position is monitored, and a function indicating the relationship between the matching position information and time is created, and the time of reaching a predetermined deviation amount is predicted by extrapolating to the function, so that the readjustment time may be set.

The fourth embodiment relates to stabilization of secondary electron detection efficiency when moving the field-of-view by the image shift. Firstly, the secondary electron detection method of the scanning electron microscope will be described with reference to FIG. 6. A secondary electron 52 irradiated from the sample collides with the reflector 7 having a hole at the center, and a secondary electron 53 is newly irradiated from the arrival position of the secondary electron 52 on the reflecting plate 7. Thereafter, after being drawn by a negative voltage (not shown) applied to the detector 17, the secondary electron 53 is converted into an electrical signal and detected.

Figure 6:
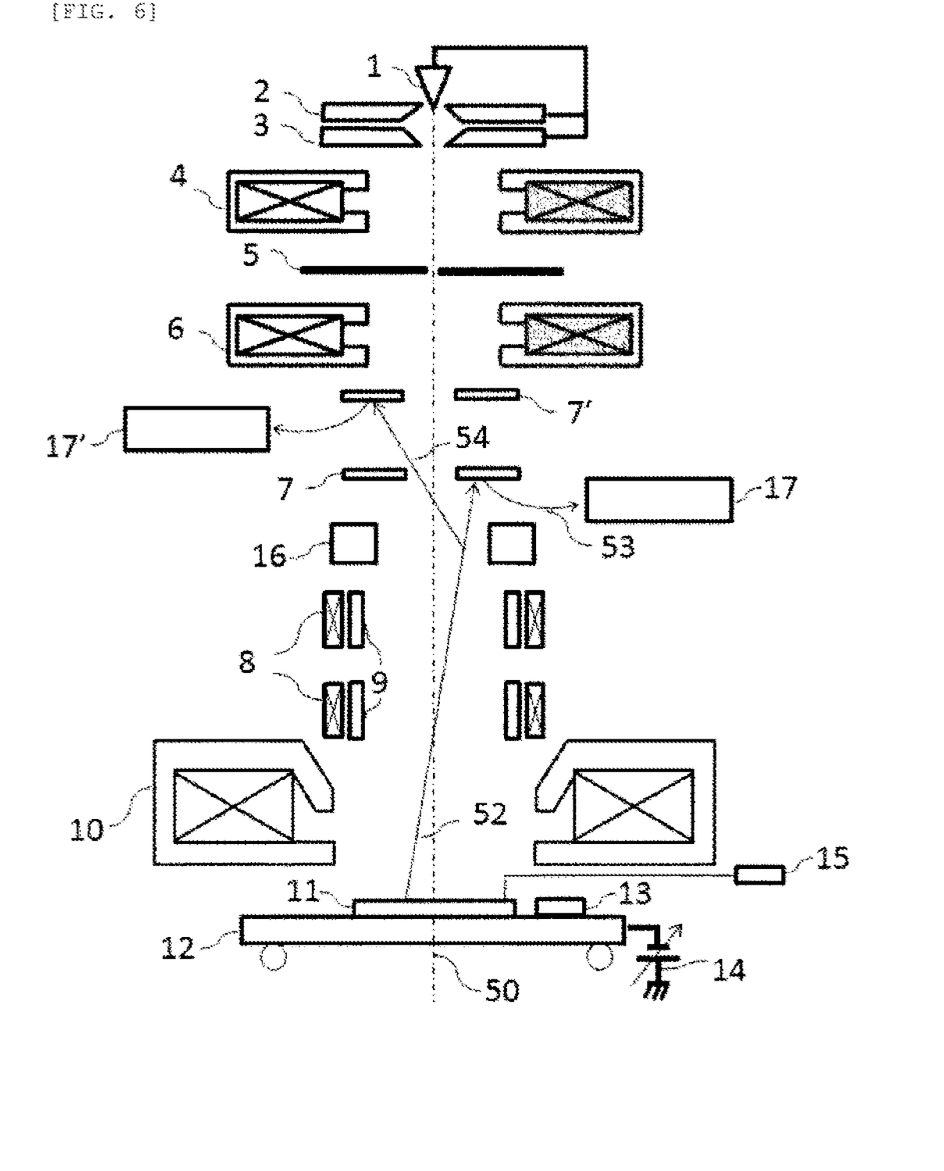
FIG. 6 is a diagram schematically illustrating an overview of a scanning electron microscope including the field-of-view moving deflector.

Further, there are cases in which the secondary electron 54 deflected by the secondary electron deflector 16 collides with the reflecting plate 7' and the signal electron irradiated from the reflecting plate 7' is similarly detected by the detector 17'. An example of the secondary electron deflector 16 is a Wien filter that deflects only the secondary electron without deflecting the primary electron by superimposing the deflection fields of the electric field and the magnetic field. When the secondary electron 52 is detected using the detector 17', the secondary electron 52 can also be directly deflected and detected by the secondary electron deflector 16 without using the reflecting plate 7, 7'.

In such a secondary electron detection mechanism, in order to perform emission angle discrimination and energy discrimination of the secondary electron 52, the secondary electron deflector 16 is appropriately controlled, and it is important to stably pass the secondary electron 52 emitted from the sample 11 to the holes provided in the reflecting plate 7 at the desired emission angle and energy. When the field-of-view is moved by the image shift, the amount of current and the voltage value applied to the secondary electron deflector 16 are changed according to the field-of-view movement amount, so that the secondary electron of the desired emission angle and energy can always be detected stably.

However, if the relationship between the control value of the objective lens 10 and the actually generated magnetic field changes, since the rotation angle of the secondary electron 52 also changes, the secondary electron of a desired emission angle and energy are not selectively detected. This embodiment describes a method of appropriately controlling the trajectory of the secondary electron of the desired emission angle and energy by the secondary electron deflector 16, even if the rotation angle of the magnetic field is changed due to hysteresis or temperature change of the electromagnetic lens.

The amount of current of or voltage value applied to the secondary electron deflector 16 is controlled according to the field-of-view movement amount IS=(X, Y) by the image shift and the amount of current supplied to the objective lens 10 (or control value thereof). Therefore, when the relationship between the amount of current supplied to the objective lens 10 (or its control value) and the actually generated magnetic field changes, accordingly, it is necessary to also optimize the amount of current or voltage value applied to the secondary electron deflector 16.

For this purpose, the rotation angle deviation $\Delta\theta$ obtained when the sequence shown in FIG. 3 is performed is used. $\Delta\theta$ is a relative angle (angular shift) between the direction of the image obtained in advance by experiments or calculations and the image obtained when a predetermined current is actually supplied to the objective lens 10. If there is no shift between the relation of the amount of current and the magnetic field acquired in advance and the relation between the actual amount of current and the magnetic field, the rotation angle deviation $\Delta\theta$ obtained by the sequence of FIG. 3 is zero. Therefore, the relationship between the amount of current (or its control value) applied to the objective lens 10 and the magnetic field actually generated can be corrected from the rotation angle deviation $\Delta\theta$. The correction equation of the amount of current or a voltage value ($AL_X$, $AL_Y$) applied to the secondary electron deflector 16 is as follows (Formula 6).

$$\begin{pmatrix} AL_X \\ AL_Y \end{pmatrix} = \begin{pmatrix} \cos \Delta\theta_{SE} & -\sin \Delta\theta_{SE} \\ \sin \Delta\theta_{SE} & \cos \Delta\theta_{SE} \end{pmatrix} \begin{pmatrix} \alpha & \beta \\ \gamma & \zeta \end{pmatrix} \begin{pmatrix} X \\ Y \end{pmatrix} + \begin{pmatrix} C_X \\ C_Y \end{pmatrix} \quad \text{Formula 6}$$

$$\Delta\theta_{SE} = C_{SE}\Delta\theta$$

Here, the parameters of $\alpha$, $\beta$, $\gamma$ and $\zeta$ are set in advance to values acquired by experiments or calculations. Further, $C_X$ and $C_Y$ are offset values for causing the secondary electron of a desired emission angle and energy to pass through the holes of the reflecting plate 7 at the field-of-view movement amount 0 by the image shift. In addition, $C_{SE}$ is a coefficient relating the rotation angle deviation $\Delta\theta$ of the primary electron 51 and the rotation angle deviation $\Delta\theta_{SE}$ of the secondary electron. The energy of the primary electron 51 and the secondary electron 52 are different when passing through the electromagnetic field of the objective lens 10. Therefore, the rotation angle deviation $\Delta\theta$ obtained by the sequence of FIG. 3 cannot be used as it is for correcting the amount of current or voltage applied to the secondary electron deflector 16.

Here, the coefficient $C_{SE}$ needs to be changed when the amount of current or value applied to the electromagnetic lens and the electrostatic lens changes. $C_{SE}$ may be obtained by experiment or may be calculated by calculation. In addition, each parameter used here needs to use different values when the optical conditions (such as the amount of current and the voltage value applied to each lens) are changed.

If the above control is used, even if the trajectory of the secondary electron changes due to hysteresis or temperature change of the electromagnetic lens, it is possible to selectively select the secondary electron emitted from the sample at a desired emission angle or energy.

REFERENCE SIGN LIST 1 electron source
2 first anode
3 second anode
4 first condenser lens
5 objective aperture
6 second condenser lens
7, 7' reflecting plate
8 field-of-view moving electromagnetic deflector
9 field-of-view moving electrostatic deflector
10 objective lens
11 sample
12 stage
13 reference pattern
14 retarding voltage applied part
15 surface potential measurement
16 secondary electron deflector
17, 17' detector
30 measurement point
40, 41, 42 field-of-view of acquired image
50 optical axis
51 first electron
52, 52, 53 secondary electron
60, 61, 62, 63 center axis of image

The invention claimed is:

1. A charged-particle beam device comprising:
an objective lens whereby a charged-particle beam from a charged particle source is focused and irradiated onto a sample;
a field-of-view moving deflector which deflects the charged-particle beam;
a stage which places the sample; and
a control device configured to:
control lens conditions for the objective lens in such a manner that the charged-particle beam focuses on a sample to be measured;
move a field-of-view via the field-of-view moving deflector while maintaining the lens conditions;
acquire an image for each of a plurality of reference patterns arranged in a specified direction, or acquire a plurality of images at each position among a reference pattern extending in a specified direction; and
calculate a rotation angle deviation between the plurality of acquired images to adjust the signal supplied to the field-of-view moving deflector based on the rotation angle deviation.

2. The charged-particle beam device according to claim 1, wherein
the reference pattern is disposed on the stage, and the control device moves the stage such that the field-of-view is positioned in the reference pattern after focus adjustment is performed on the sample to be measured.

3. The charged-particle beam device according to claim 1, wherein
the objective lens is an electromagnetic lens and includes an electrostatic lens different from the electromagnetic lens, and the control device performs focus adjustment on the reference pattern with the electrostatic lens.

4. The charged-particle beam device according to claim 1, wherein
a rotation angle of a charged-particle beam due to a magnetic field of the electromagnetic lens is calculated from the plurality of acquired images of the reference patterns.

5. The charged-particle beam device according to claim 4, wherein
the rotation angle deviation is calculated from a relative positional relationship of a plurality of measurement points on the sample to be measured, or an order of measuring the plurality of measurement points, or an off-axial aberration amount of the objective lens produced during field-of-view movement by the image shift.

6. The charged-particle beam device according to claim 1 further comprising:
an electrostatic lens which focuses the charged-particle beam; and a surface potential measuring device which measures a surface potential of the sample to be measured, wherein
the control device adjusts the field-of-view moving deflector based on a potential measured by the surface potential measuring device, a voltage applied to the electrostatic lens and information obtained from rotation angle information obtained from the plurality of images obtained for the reference pattern.

7. The charged-particle beam device according to claim 1, wherein
the control device performs pattern matching between the image acquired on the sample to be measured and design data, and moves the field-of-view to the reference pattern based on a result of the pattern matching.

8. The charged-particle beam device according to claim 1, wherein
the control device performs pattern matching a plurality of times, and moves the field-of-view to the reference pattern based on the result of the pattern matching.

9. The charged-particle beam device according to claim 1 further comprising:
a deflector for deflecting a secondary electron; and a secondary electron detector which detects a deflected secondary electron by the deflector for deflecting a secondary electron, wherein
the control device adjusts deflection conditions of the deflector for deflecting a secondary electron based on information obtained from images of a plurality of reference patterns acquired while maintaining the lens conditions.

10. The charged-particle beam device according to claim 9, wherein
the deflector for deflecting a secondary electron is a Wien filter.

* * * * *